United States Patent [19]
Jensen

[11] Patent Number: 5,015,956
[45] Date of Patent: May 14, 1991

[54] MAGNETIC RESONANCE TOMOGRAPHY METHOD FOR DETERMINING THE NUCLEAR MAGNETIZATION IN A NUMBER OF PARALLEL SLICES

[75] Inventor: Jens D. Jensen, Hamburg, Fed. Rep. of Germany

[73] Assignee: U.S. Philips Corp., New York, N.Y.

[21] Appl. No.: 436,520

[22] Filed: Nov. 14, 1989

[30] Foreign Application Priority Data

Nov. 17, 1988 [DE] Fed. Rep. of Germany ....... 3838792

[51] Int. Cl.$^5$ ............................................. G01R 33/20
[52] U.S. Cl. ................................................... 324/309
[58] Field of Search ............. 324/300, 307, 309, 310, 324/311, 312, 313, 314, 318, 322; 128/653 A

[56] References Cited

U.S. PATENT DOCUMENTS

| | | | |
|---|---|---|---|
| 4,322,684 | 3/1982 | Hounsfield | 324/309 |
| 4,458,203 | 7/1984 | Young | 324/307 |
| 4,558,278 | 12/1985 | Young | 324/311 |
| 4,651,096 | 3/1987 | Buonocore | 324/309 |
| 4,665,367 | 5/1987 | Kramer | 324/309 |
| 4,847,560 | 7/1989 | Sattin | 324/314 |

Primary Examiner—Michael J. Tokar
Attorney, Agent, or Firm—Jack D. Slobod

[57] ABSTRACT

The invention relates to a fast method for the formation of a set of survey images of the nuclear magnetization in adjoining slices. First the nuclear magnetization in orthogonal slices which extend perpendicularly to the slices is excited during a plurality of successive cycles. Then the nuclear magnetization distribution for the individual slices is derived from the nuclear magnetization distribution of the orthogonal slices. Comparatively short measuring times can be achieved by means of such a method.

4 Claims, 3 Drawing Sheets

MAGNETIC RESONANCE TOMOGRAPHY METHOD FOR DETERMINING THE NUCLEAR MAGNETIZATION IN A NUMBER OF PARALLEL SLICES

BACKGROUND OF THE INVENTION

For various magnetic resonance examinations physicians prefer to have a survey first of the nuclear magnetization distribution in a three-dimensional volume. To achieve this there are methods where the volume is exposed to a plurality of sequences which comprise at least one RF pulse which acts on the entire volume. Such methods necessitate a very large dynamic range for the processing of the spin resonance signals produced in the volume and are rather time-consuming, because the magnetic gradient field which is switched on and off subsequent to each RF pulse must be varied in two mutually perpendicular directions from one sequence to another.

It is also known that the nuclear magnetization distribution in a three-dimensional region can be determining by measuring the nuclear magnetization in a number of adjoining parallel slices. The so-called multi-slice methods (see "Principles of MR imaging", published by Philips Medical Systems 1984, p. 48) result in short overall measuring times. According to these methods the repetition time which must elapse after a sequence before the next sequence can act on the same slice is used to excite the nuclear magnetization in other slices. This result in an overall measuring time which is determined by the resolution and the repetition time. When the nuclear magnetization distribution in the individual slices of the volume is to be determined with a resolution of 128×128 pixels, and the repetition time amounts to 1 second, the measuring time is still more than 2 minutes.

SUMMARY OF THE INVENTION

It is the object of the present invention to provide a method which enables the measuring time required for forming a set of two-dimensional survey images ("scout scans") of the nuclear magnetization distribution to be reduced without leading to more severe requirements as regards the dynamic range during the processing of the spin resonance signals.

This object is achieved in accordance with the invention in that for the determination of the nuclear magnetization distribution in a number of parallel slices, first a plurality of adjacent orthogonal slices extending perpendicularly thereto are excited by a respective sequence during a first measuring cycle, each sequence including the formation of at least one slice-selective RF pulse and subsequently the switching on and off of a magnetic gradient field extendign perpendicularly ot said slices and also includes the reception of a spin resonance signal, said slices being excited again during further cycles, the time integral over the magnetic gradient field being varied from one cycle to another, the nuclear magnetization distribution in the orthogonal slices being determined from the spin resonance signals, the nuclear magnetization distribution in the slices being determined from the distributions thus determined.

Thus, in accordance with the invention instead of exciting the slices whose nuclear magnetization distribution is to be represented in the survey images the slices extending perpendicularly thereto (referred to as orthogonal) slices are excited. Consequently, the nuclear magnetization distribution in the slice must be determined from the nuclear magnetization distributions of the orhogonal slices. Because the number of slices can be substantially smaller than the number of pixels in each of the two directions parallel to the slice, the orthogonal slices can be successively excited by an uninterrupted succession of sequences, without the distance in time between two successive excitations of the same orthogonal slice becoming shorter than the repetition time.

A magnetic resonance tomography apparatus for performing the method in accordance with the invention comprises a magnet for generating a uniform, steady magnetic field, an RF coil system for generating magnetic RF pulses, a gradient coil system for switching a magnetic gradient field on and off during and after the RF pulse, a reconstruction unit for reconstructing the nuclear magnetization distribution of an orthogonal slice, a storage device for storing the nuclear magnetization distributions of a plurality of orthogonal slices, and a control unit for controlling the various components which is constructed so that from the nuclear magnetization distributions of a plurality of mutually parallel orthogonal slices the nuclear magnetization distribution of at least one slice extending perpendicularly thereto can be read.

BRIEF DESCRIPTION OF THE DRAWING

The invention will be described in detail hereinafter with reference to the drawing. Therein.

DETAILED DESCRIPTION OF THE PREFERRED EMBODIMENTS

Figure 1:
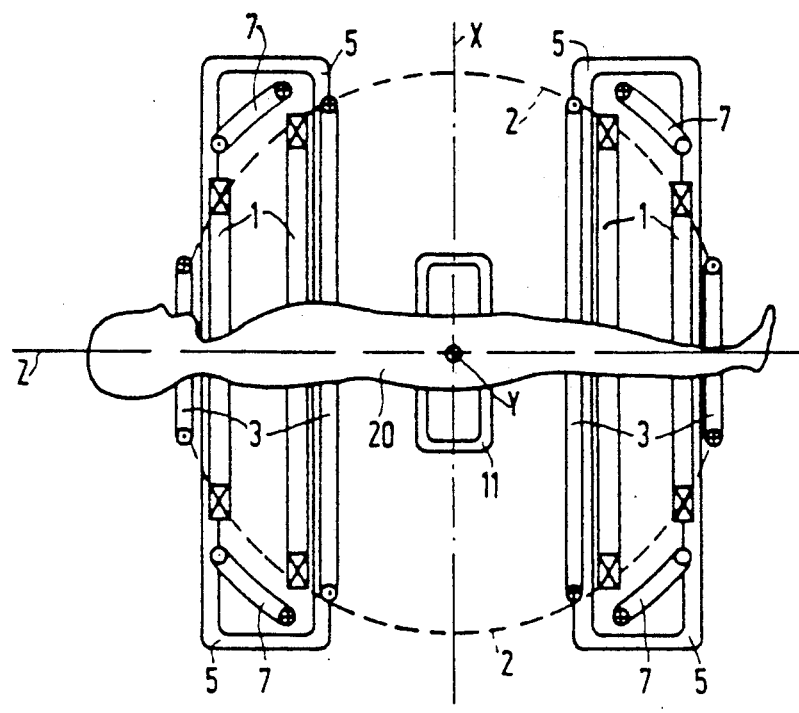
FIG. 1 shows a magnetic resonance tomography apparatus which is suitable for performing the method in accordance with the invention.

The magnetic resonance tomography apparatus which is diagrammatically shown in FIG. 1 comprises a system which consists of four coils 1, for generating a uniform, steady magnetic field which may be in the order of magnitude of from some tenths of T to some T. This field extends in the z direction of a cartesian coordinate system. The coils 1 which are concentrically arranged with respect to the z-axis may be situated on spherical surface 2. The patient 20 to be examined is situated within these coils.

In order to generate a magnetic field Gz which extends in the z direction and which linearly varies in this direction, there are provided four coils 3 which are preferably situated on the same spherical surface. There are also provided four coils 7 which generate a magnetic gradient field Gx which also extends in the z duration but whose gradient extends in the x-direction. A magnetic gradient field Gy which extends in the z direction and which has a gradient in the y direction is generated by four coils 5 which may be identical to the coils 7 but which are arranged so as to be offset 90° in space with respect thereto. Only two of the coils 5 are visible in FIG. 1.

Because each of the three coil systems 3, 5 and 7 for generating the magnetic gradient fields Gz, Gy and Gx is symmetrically arranged with respect to the spherical surface 2, the field strength in the centre of the sphere, being at the same time the origin of said cartesian s, y, z coordinate system, is determined exclusively by the steady, uniform magnetic field of the coil system 1.

Furthermore, an RF coil 11 is symmetrically arranged with respect to the plane z=0 of the coordinate system, this coil is constructed so that it generates an essentially uniform RF magnetic field which extends in the x direction, that is to say perpendicularly to the direction of the steady, uniform magnetic field. During each RF pulse the RF coil receives an RF-modulated current from an RF generator. Subsequent to one or more RF pulses, the RF coil 11 serves to receive the echo signals produced in the examination zone by spin resonance. However, alternatively use could be made of a separate RF receiver coil.

Figure 2:
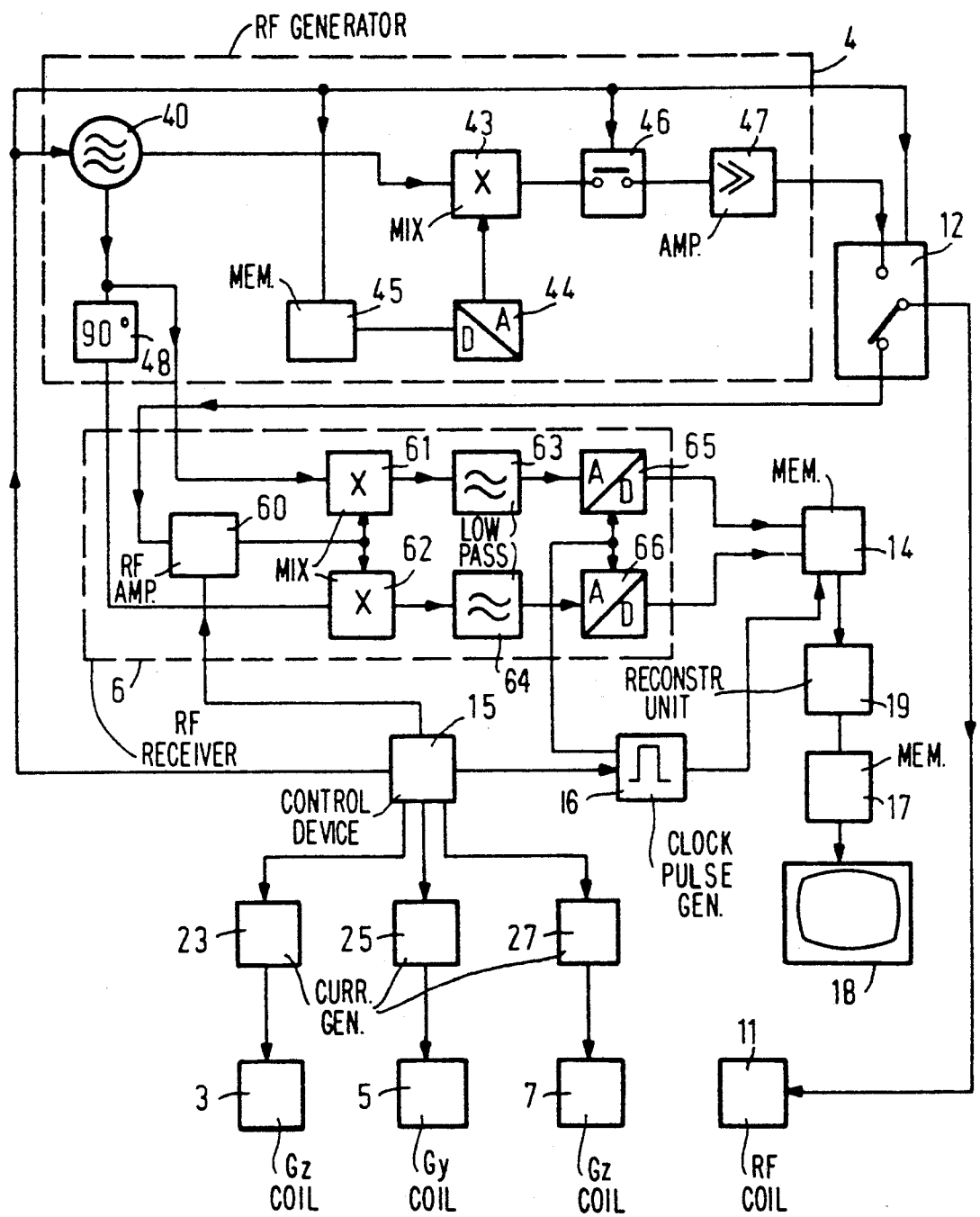
FIG. 2 shows a block diagram of such an apparatus.

FIG. 2 shows a simplified block diagram of this magnetic resonance tomography apparatus. Via a switching device 12, the RF coil 11 is connected to an RF generator 4 on the one side and to an RF receiver 6 on the other side.

The RF generator 4 comprises an RF oscillator 40 whose frequency can be digitally controlled and which generates oscillations of a frequency equal to the Larmor frequency of, for example hydrogen nuclei. The Larmor frequency f is calculated in known manner according to the relation f=cB, where B is the magnetic flux density in the steady, uniform magnetic field and c is the gyromagnetic ratio which, for example for hydrogen nuclei amounts to 42.56 MHz/T. The output of the oscillator 40 is connected to an input of a mixing stage 43. The mixing stage 43 receives a second input signal from a digital-to-analog converter 44 whose input is connected to a digital memory 45. Under the control of a control device 15, a series of digital data words representing an envelope signal, is read from the memory 45.

The mixing state 43 processes the input signals applied thereto so that the carrier oscillation modulated with the envelope signal appears on its output. The output signal of the mixing stage 43 is applied, Via a switch 46 which is controlled by the control device 15, to an RF power amplifier 47 whose output is connected to the switching device 12. This device is also controlled by the control device 15.

The receiver 6 comprises an RF amplifier 60 which is connected to the switching device and which receives the echo signals induced in the RF coil 11 and produced by spin resonance when the switching device 12 is appropriately controlled. The amplifier 60 comprises a muting input which is controlled by the control device 15 and via which it can be blocked so that its gain is substantially zero. The output of the amplifier 60 is connected to the first inputs of two multiplying mixing stages 61 and 62, each of which supplies an output signal which corresponds to the product of its input signals. The second inputs of the mixing stages 61 and 62 receive a signal having the frequency of the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied to a respective analog-to-digital converter 65, 66, via low-pass filters 63 and 64 which cut off the frequency supplied by the oscillator 40 as well as all higher frequencies and which conduct low-frequency components. The analog-to-digital converters convert the analog signals from the circuit 61 . . . 64, forming a quadrature demodulator, into digital data words which are applied to a buffer memory 14. The analog-to-digital converters 65 and 66 as well as the memory 14 receive their clock pulses from a clock pulse generator 16 which can be blocked and enabled by the control device 15 via a control lead, so that the signals supplied by the RF coil 11 can be converted into a series of digital data words for storage in the memory 14 only during a measureming interval which is defined by the control device 15.

The three gradient coil systems 3, 5 and 7 receive a respective current from current generators 23, 25 and 27 whose variation in time can be controlled by the control device 15. The data words or sampling values stored in the buffer memory 14 are applied to a reconstruction unit 19 which determines the spatial distribution of the nuclear magnetization in the various orthogonal slices therefrom and which stores the distribution determined in a memory device 17. The nuclear magnetization distribution can be displayed on a monitor 18.

Figure 3:
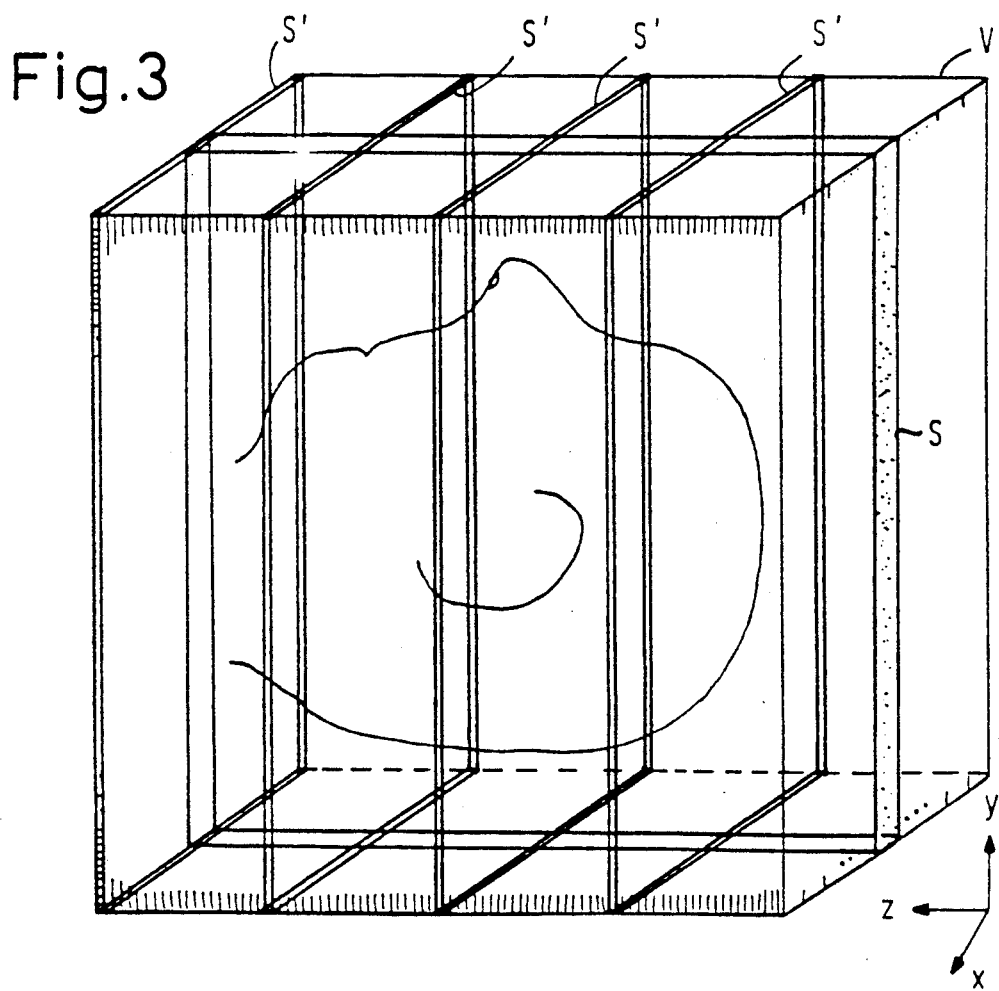
FIG. 3 shows the situation in space of the slices and the orthogonal slices with respect to an object to be examined.

FIG. 3 shows, by way of example, the formation of a set of survey images of a skull which together represent a sagittal slice. The survey images show the nuclear magnetization distribution in $n_x$ adjacent, comparatively thick slices which together define an approximately cubic volume V. For example, $n_x=32$. The slices extend parallel to the y-z plane. FIG. 3 shows only one of these slices S.

For the determination of the nuclear magnetization distribution in the slice S (and in the slices parallel thereto), the nuclear magnetization is excited in comparatively thin, adjacent slices S' which extend perpendicularly thereto and which together define the volume V. These slices S', extending parallel to the x-y plane and whose number amounts to $n_z$, are referred to as "orthogonal slices" hereinafter. The spin resonance signals obtained by excitation of the orthogonal slices are used to determine the nuclear magnetization distribution in the orthogonal slices; therefrom the nuclear magnetization distribution can be derived in the strip in which the relevant slice S is intersected by the individual orthogonal slices. The thickness of the orthogonal slices S' determines the resolution in the z direction. It is assumed that the volume V contains $n_z=128$ orthogonal slices S', that is to say substantially more orthogonal slices than slices S.

$n_x$ sequences act on each of the $n_z$ orthogonal slices S', i.e. as many as there are slices S in the volume V, so 32 in the present example. The amplitude of a magnetic field intended for phase encoding is varied from one sequence to another, its gradient extending perpendicularly to the desired slice S, i.e. in the x direction. When the spin resonance signals are read, a magnetic gradient field having a gradient which extends in the remaining direction, i.e. in the y direction, is excited and its spin resonance signal is sampled $n_y$ times, $n_y$ preferably being equal to $n_z$, so 128 in the present example. The sampling values thus obtained for the spin resonance signals from an orthogonal slice are subjected to a customary two-dimensional Fourier transformation in the reconstruction unit 19; therefrom the nuclear magnetization distribution in the relevant orthogonal slice is obtained. Subsequently, the nuclear magnetization distribution in the slice S is composed from the nuclear magnetization distribution in the strips in which the orthogonal slices S' intersect the relevant slice S.

Figure 4:
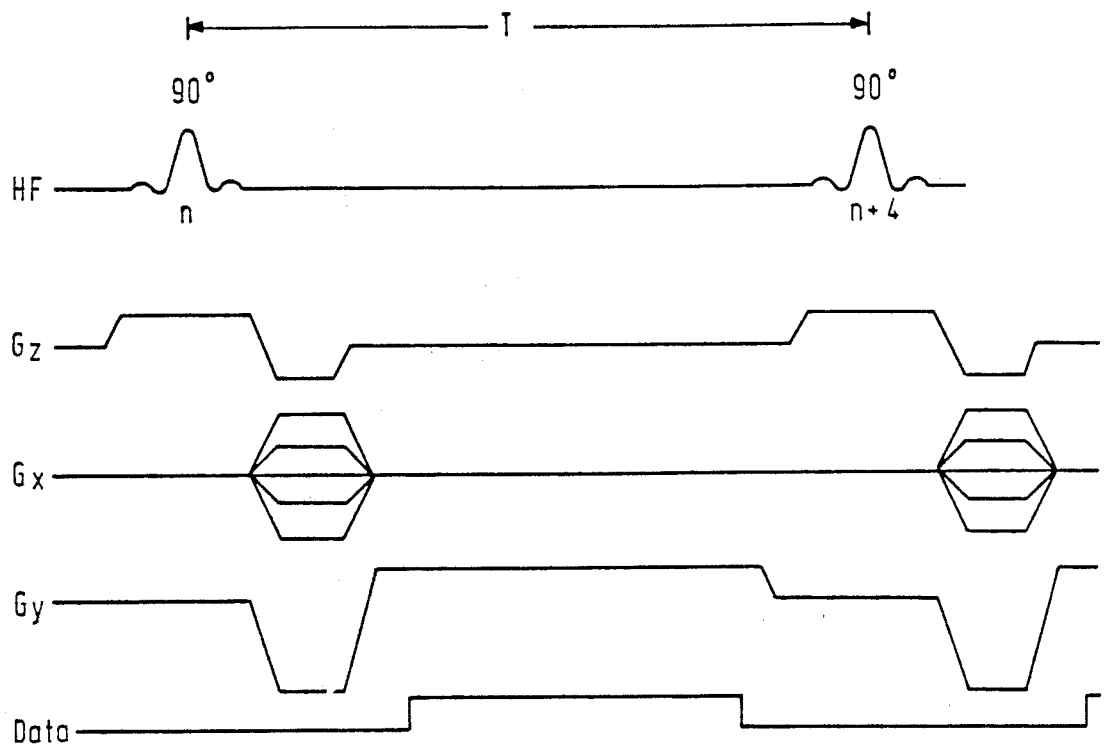
FIG. 4 shows the variation in time of the signals of a sequence.

FIG. 4 shows the variation time of the signals in a sequence. Each sequence contains an RF pulse (first line) which is generated in the presence of a magnetic gradient field $G_z$ (second line) and which rotates the nuclear magnetization in an arbitrary orthogonal slice through 90° with respect to the z direction. Subsequent to this RF pulse, the magnetic gradient field $G_x$ is switched on and off for phase encoding (third line). Moreover, the magnetic gradient field $G_y$ is first switched on with a negative polarity and, after the deactivation of the gradient field $G_x$, with a positive polarity (or vice versa) (fourth line). When the time interval of the gradient field $G_y$ has the value zero, the nuclear magnetization influenced by this gradient field has been refocused and the spin resonance signal occurring approximately at this instant, i.e. after deactivation of the gradient field $G_x$ and before deactivation of the gradient field $G_y$, is detected and processed in the receiver 6. During the interval the clock pulse generator 16 is enabled (the enable signal is represented on the fifth line), so that the signals supplied by the RF coil 11 and converted to the low-frequency range are transposed into a series of digital data words for storage in the buffer memory. The period of time during which the clock pulse generator 16 is enabled in $n_y$ times longer than the period of the clock pulses generated by the clock pulse generator 16, so that each time 128 pairs of values are applied to the buffer memory 14.

After expiration of this enabling period and deactivation of the magnetic gradient field $G_y$, the sequence for the $n^{th}$ orthogonal slice has been terminated (the respective number "n" of the slice is given below the RF pulse), and the next sequence can be generated, be it for a different orthogonal slice. Preferably, the frequency of the RF pulse (i.e. the frequency of the oscillator 40) is chosen so that not the next orthogonal (n+1) is excited, but the fourth orthogonal slice (n+4) succeeding the orthogonal slice n, so that the artefacts which could occur in the case of successive excitation in time of two directly neighbouring slices can be avoided. During this next sequence the variation in time of the magnetic gradient field $G_x$, $G_y$ and $G_z$ is the same as that during the preceding sequence. The duration T of a sequence may amount to, for example 20 ms.

Figure 5:
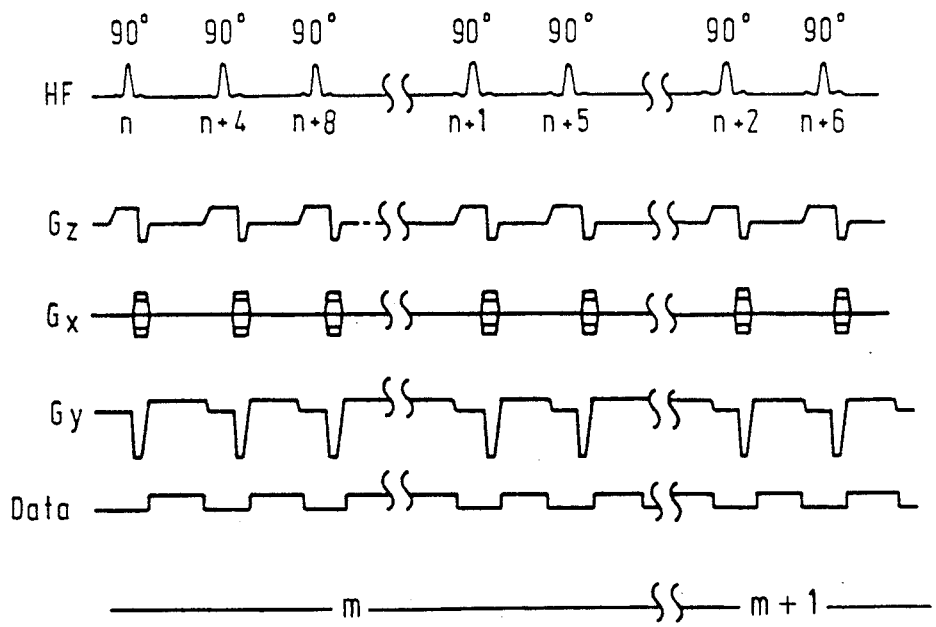
FIG. 5 shows the variation in time of the signals in a cycle of sequences.

As appears from FIG. 5, showing the same signals as FIG. 4 but in a time-compressed manner, the next sequence but one excites the slice n+8, etc. During the remainder of a cycle m, the slices n+1, n+5, ..., and later the slices n+2, n+6, ..., and ultimately the slices n+3, n+7, ..., are excited. Thus, during one cycle all orthogonal slices are excited once.

The described $m^{th}$ cycle is succeeded by the cycle m+1 during which the orthogonal slices S' are excited by a respective sequence in the same succession as before. The sequences deviate from the sequences of the preceding cycle merely in that the phase encoding gradient $G_x$ has a different value. The cycle m+1 is followed by further cycles, merely the phase encoding gradient $G_x$ being changed from one cycle to another.

After $n_x$ (=32) cycles, the measurements have been completed. The measuring time for a measuring cycle corresponds to the product of the number $n_z$ of orthogonal slices S' and the duration T of a sequence; for the present example, this results in a measuring time of approximately 2.5 seconds per slice. This time, elapsing between two successive excitations of the same splice, is so long that the previously excited nuclear magnetization has completely decayed. The overall measuring time results from the number $n_x$ of cycles and the duration of a cycle. For the stated values the overall measuring time amounts to approximately 80 seconds.

If the 32 slices S had been directly excited by means of a respective sequence instead, the duration of a measuring cycle would be 640 ms (32×T). At the end of such a cycle, the excitation of the nuclear magnetization in the slice first excited during this cycle, however, has not yet decayed, so that a waiting period must elapse before the next cycle commences. Thus, the distance in time between two cycles amounts to at least 1000 ms. When the nuclear magnetization in the slice is to be determined with a resolution of 128×128 pixels, 128 of such cycles are required, resulting in a measuring time of more than two minutes.

For the method in accordance with the invention, the overall measuring time can be further reduced by reducing the number of orthogonal slices S', for example to $n_z'$, thus limiting the image to the volume of interest. Contrary to the customary two-dimensional methods, this does not affect the spatial resolution, because the image reconstruction in the direction of the orthogonal slices does not require Fourier transformation, the desired images are composed merely by linking the measured orthogonal slices. Thus, images of $n_z' \times 128$ pixels can also be formed.

From the sampling values extrated during the various cycles the nuclear magnetization distribution in the individual orthogonal slices S' is reconstructed in known manner. For each slice there are $n_y \times n_x$ pixels, i.e. 128×32 pixels. Assuming that the volume V has an approximately cubic shape, this means that the resolution in the y direction is substantially higher than that in the x direction, i.e. in the direction perpendicular to the slice.

The memory 17 should have a storage capacity which suffices at least for storing the nuclear magnetization of $n_x \times n_y \times n_z$ (32×128×128) pixels. The reconstructed nuclear magnetization distribution can be written in the memory 17 so that the nuclear magnetization of the pixels having the same x-coordinate are stored at successive adresses in the memory, so that the nuclear magnetization distribution is read one slice after the other when the memory contents are read with an ascending order of addresses. However, it is alternatively possible to store the nuclear magnetization of each orthogonal slice in a coherent address range and to preset the addresses during reading so that the nuclear magnetization distribution of each time one slice is read. The determination of the nuclear magnetization distribution in the slices S from the nuclear magnetization distribution of the orthogonal slices S' thus becomes a sorting operation either during writing in or reading from the memory, 17.

The invention has been described with reference to an embodiment where each sequence comprises only a single slice-selective RF pulse. However, the orthogonal slices can alternatively be excited by sequences comprising each time one slice-selective 90° RF pulse which is succeeded by a slice-selective 180° RF pulse, the resultant spin echo signal being used for reconstructing the nuclear magnetization distribution. For these sequences the image contrast can be influenced inter alia by selecting the distance in time between the two RF pulses, i.e. the so-called echo time. In order to avoid a substantial prolongation of the overall measuring time in the case of long echo times, it may be advantageous to interleave the individual sequences in time as described in DE-OS No. 36 31 039.

I claim:

1. A magnetic resonance tomography method, characterized in that for the determination of the nuclear magnetization distribution in a slice (S) first a plurality of mutually parallel slices (S') extending perpendicularly to the slice (S) are excited by cycles of sequences, each sequence including the formation of at least one slice-selective RF pulse and subsequently the switching on and off of a magnetic gradient field (Gx) extending perpendicularly to said slice (S) and also includes the reception of a spin resonance signal, the time integral over the magnetic gradient field (Gx) being varied from one cycle to another, the nuclear magnetization distribution in the mutually parallel slices (S') being determined from the spin resonance signals, the nuclear magnetization distribution in the slice (S) being determined from the distributions thus determined.

2. A magnetic resonance tomography method as claimed in claim 1, characterized in that within a cycle slices (S') which are situated at a distance from one another are excited by successive sequences.

3. A magnetic resonance tomography method as claimed in claim 1, characterized in that each sequence excites a slice (S') by means of a 90° RF pulse and a subsequent 180° RF pulse, the spin echo signals thus generated being used for reconstructing the nuclear magnetization distribution, the sequences of a cycle being interleaved in time so that the first RF pulse of a sequence is generated before the spin echo signal produced by the preceding sequence has been received.

4. A magnetic resonance tomography apparatus for for the determination of the nuclear magnetization distribution in a slice (S) in an examination zone, comprising a magnet (1) for generating a uniform, steady magnetic field in the examination zone, means for generating cycle of sequences for exciting a plurality of mutually parallel slices (S') in the examination zone, which are orthogonal to the slice (S) comprising: an RF coil system for generating magnetic RF excitation pulses in the examination zone, a gradient coil system for generating a slice-selection magnetic gradient field during said excitation pulses and for switching a magnetic gradient field on and off after the RF excitation pulse, means for receiving spin resonance signals from said examination zone, a reconstruction unit for reconstructing the nuclear magnetization distribution of the mutually parallel slices (S') from the received spin resonance signals, a storage device for storing the nuclear magnetization distributions of the plurality of mutually parallel slices (S'), and a control unit for controlling the cycles generating means in a manner that from the nuclear magnetization distributions of the plurality of mutually parallel slices the nuclear magnetization distribution of the slice (S) can be determined.

* * * * *